(12) United States Patent
Kreuzer

(10) Patent No.: US 10,908,516 B2
(45) Date of Patent: Feb. 2, 2021

(54) METROLOGY TOOL AND METHOD OF USING THE SAME

(71) Applicant: ASML HOLDING N.V., Veldhoven (NL)

(72) Inventor: Justin Lloyd Kreuzer, Trumbull, CT (US)

(73) Assignee: ASML Holding N.V., Veldhoven (NL)

(*) Notice: Subject to any disclaimer, the term of this patent is extended or adjusted under 35 U.S.C. 154(b) by 0 days.

(21) Appl. No.: 16/466,315

(22) PCT Filed: Dec. 13, 2017

(86) PCT No.: PCT/EP2017/082519
§ 371 (c)(1),
(2) Date: Jun. 4, 2019

(87) PCT Pub. No.: WO2018/121987
PCT Pub. Date: Jul. 5, 2018

(65) Prior Publication Data
US 2020/0064746 A1  Feb. 27, 2020

Related U.S. Application Data

(60) Provisional application No. 62/439,675, filed on Dec. 28, 2016.

(51) Int. Cl.
*G03F 7/20* (2006.01)

(52) U.S. Cl.
CPC .............................. *G03F 7/70683* (2013.01)

(58) Field of Classification Search
CPC ............. G03F 7/70633; G03F 7/70616; G03F 7/70625; G03F 7/70508; G03F 7/70641;
(Continued)

(56) References Cited

U.S. PATENT DOCUMENTS

| 5,969,441 A | 10/1999 | Loopstra et al. |
| 6,091,845 A | 7/2000 | Pierrat et al. |

(Continued)

FOREIGN PATENT DOCUMENTS

| CN | 1499298 | 5/2004 |
| CN | 1661771 | 8/2005 |

(Continued)

OTHER PUBLICATIONS

International Search Report and Written Opinion issued in corresponding PCT Patent Application No. PCT/EP2017/082519, dated Mar. 1, 2018.

(Continued)

*Primary Examiner* — Mesfin T Asfaw
(74) *Attorney, Agent, or Firm* — Piiisbury Winthrop Shaw Pittman LLP

(57) ABSTRACT

A method including: subsequent to a first device lithographic step of a device patterning process, measuring a degraded metrology mark on an object and/or a device pattern feature associated with the degraded metrology mark, the degraded metrology mark arising at least in part from the first device lithographic step on the object; and prior to a second device lithographic step of the device patterning process on the object, creating a replacement metrology mark, for use in the patterning process in place of the degraded metrology mark, on the object.

20 Claims, 7 Drawing Sheets

(58) Field of Classification Search
CPC .... G03F 9/7088; G03F 9/7046; G03F 9/7076; G03F 7/70141; G03F 7/70683; G03F 9/708; G03F 9/7084; G03F 9/7003; G03F 9/7073; G03F 7/70525; G03F 7/70775
See application file for complete search history.

(56) References Cited

U.S. PATENT DOCUMENTS

| | | | |
|---|---|---|---|
| 6,383,888 | B1 | 5/2002 | Stirton |
| 7,587,704 | B2 | 9/2009 | Ye et al. |
| 2001/0046315 | A1 | 11/2001 | Sentoku et al. |
| 2004/0130690 | A1 | 7/2004 | Koren et al. |
| 2004/0136494 | A1 | 7/2004 | Lof et al. |
| 2005/0185183 | A1 | 8/2005 | Ban |
| 2007/0035040 | A1 | 2/2007 | Aoyama |
| 2009/0135390 | A1 | 5/2009 | La Fontaine et al. |
| 2016/0061589 | A1 | 3/2016 | Bhattacharyya et al. |
| 2016/0223322 | A1 | 8/2016 | Liu et al. |

FOREIGN PATENT DOCUMENTS

| | | |
|---|---|---|
| JP | H01-184824 | 7/1989 |
| JP | H05-047649 | 2/1993 |
| JP | 2004-165666 | 6/2004 |
| JP | 2007-49074 | 2/2007 |
| KR | 10-2006-0016492 | 2/2006 |
| TW | 201614382 | 4/2016 |
| TW | 201633009 | 9/2016 |

OTHER PUBLICATIONS

Taiwanese Office Action issued in corresponding Taiwanese Patent Application No. 106145925, dated Nov. 2, 2018.
Japanese Office Action issued in corresponding Japanese Patent Application No. 2019-529885, dated Aug. 13, 2020.
Chinese Office Action issued in corresponding Chinese Patent Application No. 201780081263.1, dated Oct. 10, 2020.

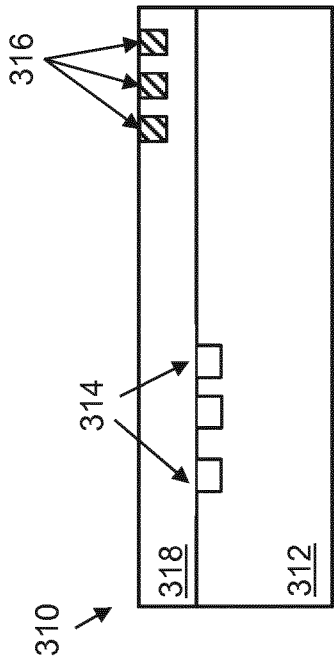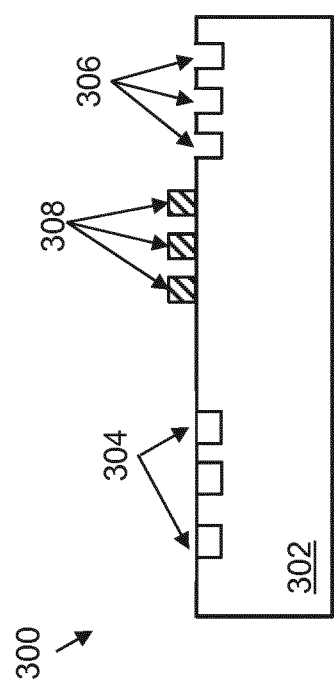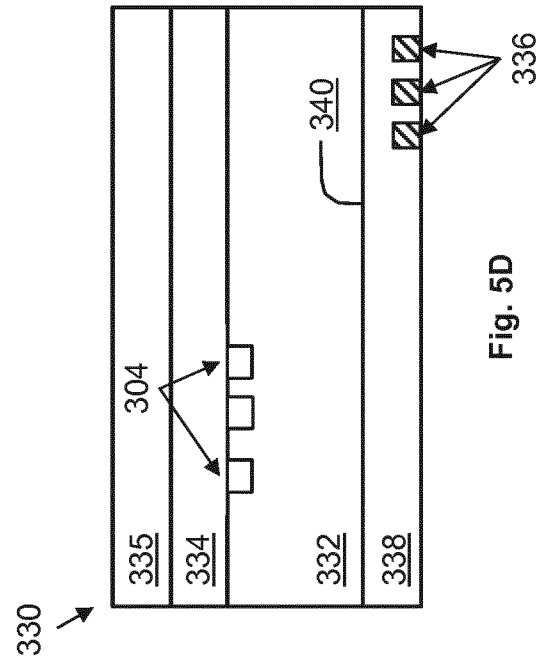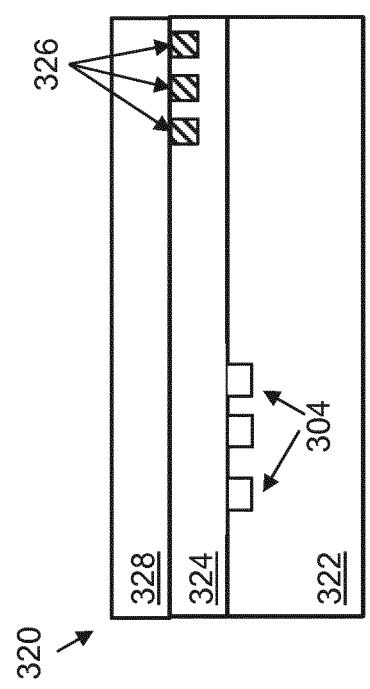

METROLOGY TOOL AND METHOD OF USING THE SAME

CROSS-REFERENCE TO RELATED APPLICATIONS

This application is the U.S. national phase entry of PCT Patent Application No. PCT/EP2017/082519, which was filed on Dec. 13, 2017, which claims the benefit of priority of U.S. Provisional Patent Application No. 62/439,675, which was filed on Dec. 28, 2016, and which is incorporated herein in its entirety by reference.

FIELD

The disclosure herein relates generally to metrology of objects in a manufacturing flow, e.g., a substrate in a semiconductor manufacturing process.

BACKGROUND

A lithography apparatus can be used, for example, in the manufacture of integrated circuits (ICs). In such a case, a patterning device (e.g., a mask) may contain or provide a device pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern of the patterning device. In general, a single substrate contains a plurality of adjacent target portions to which the pattern is transferred successively by the lithography apparatus, one target portion at a time. In one type of lithography apparatus, the pattern of the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern of the patterning device are transferred to one target portion progressively. Since, in general, the lithography apparatus will have a magnification factor M (generally <1), the speed F at which the substrate is moved will be a factor M times that at which the projection beam scans the patterning device.

Prior to transferring the pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern of the patterning device to a substrate and typically, but optionally, involves one or more related pattern processing steps, such as resist development by a development apparatus, baking of the substrate using a bake tool, etching using the pattern using an etch apparatus, etc.

SUMMARY

As noted above, a patterning process for objects can involve transferring one or more patterns to the objects, e.g., a photoresist on a substrate. Effective pattern transfer involves positioning an object prior to pattern transfer. Positioning an object can involve confirming lateral and/or rotational position of the object to receive the pattern for pattern transfer. Improving object alignment is desirable, for example, in order to increase patterning accuracy and to improve device yield. Similarly, other metrology (e.g., overlay, critical dimension (CD), patterning beam dose, focus for optical exposure, etc.) can be used in the patterning process and so improving such metrology is desirable, for example, in order to increase patterning accuracy and to improve device yield.

In an embodiment, there is provided a method comprising: subsequent to a first device lithographic step of a device patterning process, measuring a degraded metrology mark on an object and/or a device pattern feature associated with the degraded metrology mark, the degraded metrology mark arising at least in part from the first device lithographic step on the object; and prior to a second device lithographic step of the device patterning process on the object, creating a replacement metrology mark, for use in the patterning process in place of the degraded metrology mark, on the object.

In an embodiment, there is provided an apparatus, comprising: a metrology sensor configured to measure a degraded metrology mark on an object subsequent to a first device lithographic step of a device patterning process and/or measure a device pattern feature associated with the degraded metrology mark, the degraded metrology mark arising at least in part from the first device lithographic step on the object; and a mark application device configured to create a replacement metrology mark on the object prior to any subsequent device lithographic step of the device patterning process, wherein the replacement mark is used in the patterning process in place of the degraded metrology mark.

In an embodiment, there is provided an apparatus, comprising: a first metrology sensor configured to measure a degraded metrology mark on the object according to a first type of mark metrology; a mark application device configured to apply, based on the measurement of the degraded mark, a replacement metrology mark on the object; and a second metrology sensor configured to measure the replacement metrology mark according to a second type of mark metrology different from the first type of mark metrology.

These and other features of the present invention, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of "a", "an", and "the" include plural referents unless the context clearly dictates otherwise. In addition, as used in the specification and the claims, the term "or" means "and/or" unless the context clearly dictates otherwise.

BRIEF DESCRIPTION OF THE DRAWINGS

Embodiments are illustrated by way of example, and not by way of limitation, in the figures of the accompanying drawing and in which like reference numerals refer to similar elements.

FIGS. 5A-5D schematically depict cross-sectional views of an object with a metrology mark and a further metrology mark, according to an embodiment;

DETAILED DESCRIPTION

Figure 1:
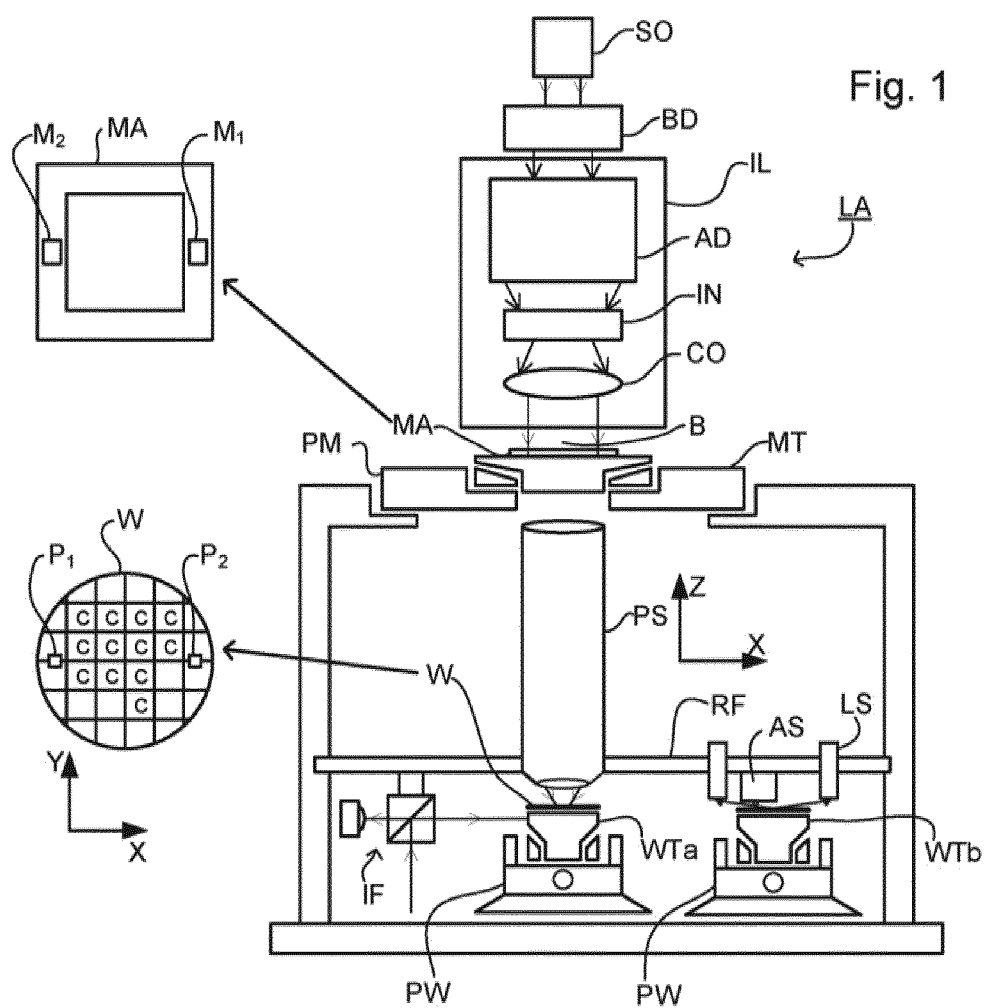
FIG. 1 depicts a schematic diagram of an embodiment of a lithographic apparatus.

FIG. 1 schematically depicts a lithographic apparatus LA in association with which the techniques described herein can be utilized. The apparatus includes an illumination optical system (illuminator) IL configured to condition a radiation beam B (e.g., ultraviolet (UV), deep ultraviolet (DUV) or extreme ultraviolet (EUV) radiation), a patterning device support or support structure (e.g., a mask table) MT constructed to support a patterning device (e.g., a mask) MA and connected to a first positioner PM configured to accurately position the patterning device in accordance with certain parameters; one or more substrate tables (e.g., a wafer table) WTa, WTb constructed to hold a substrate (e.g., a resist coated wafer) W and connected to a second positioner PW configured to accurately position the substrate in accordance with certain parameters; and a projection optical system (e.g., a refractive, reflective, catoptric or catadioptric optical system) PS configured to project a pattern imparted to the radiation beam B by patterning device MA onto a target portion C (e.g., including one or more dies) of the substrate W.

The illumination optical system may include various types of optical components, such as refractive, reflective, magnetic, electromagnetic, electrostatic or other types of optical components, or any combination thereof, for directing, shaping, or controlling radiation. In this particular case, the illumination system also comprises a radiation source SO.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted minors impart a pattern in a radiation beam, which is reflected by the mirror matrix. As another example the patterning device comprises a LCD matrix.

As here depicted, the apparatus is of a transmissive type (e.g., employing a transmissive patterning device). However, the apparatus may be of a reflective type (e.g., employing a programmable mirror array of a type as referred to above, or employing a reflective mask (e.g., for an EUV system)).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO (e.g., a mercury lamp or excimer laser, LPP (laser produced plasma) EUV source). The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the spatial and/or angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table) MT, and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using patterning device alignment marks $M_1$, $M_2$ and substrate alignment marks $P_1$, $P_2$. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the patterning device alignment marks may be located between the dies. Small alignment markers may also be included within dies, in amongst the device features, in which case it is desirable that the markers be as small as possible and not require any different imaging or process conditions than adjacent features. The alignment system, which detects the alignment markers, is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS, measuring the position of alignment markers on the substrate using an alignment sensor AS, performing any other type of metrology or inspection, etc. This enables a substantial increase in the throughput of the apparatus. More generally, the lithography apparatus may be of a type having two or more tables (e.g., two or more substrate tables, a substrate table and a measurement table, two or more patterning device tables, etc.). In such "multiple stage" devices a plurality of the multiple tables may be used in parallel, or preparatory steps may be carried out on one or more tables while one or more other tables are being used for exposures. Twin stage lithography apparatuses are described, for example, in U.S. Pat. No. 5,969,441, incorporated herein by reference in its entirety.

While a level sensor LS and an alignment sensor AS are shown adjacent substrate table WTb, it will be appreciated that, additionally or alternatively, a level sensor LS and an alignment sensor AS can be provided adjacent the projection system PS to measure in relation to substrate table WTa.

The depicted apparatus can be used in a variety of modes, including for example a step mode or a scan mode. The construction and operation of lithographic apparatus is well known to those skilled in the art and need not be described further for an understanding of embodiments of the present invention.

Figure 2:
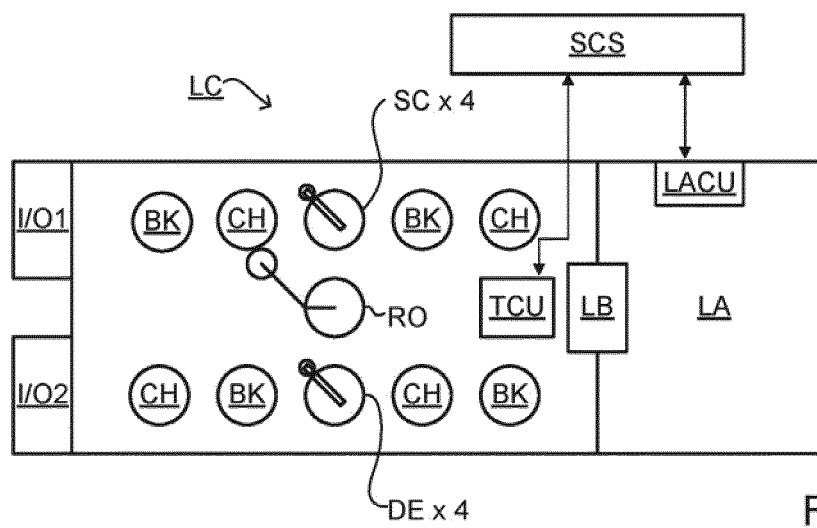
FIG. 2 depicts a schematic diagram of an embodiment of a lithographic cell.

As shown in FIG. 2, the lithographic apparatus LA forms part of a lithographic system, referred to as a lithographic cell LC or a lithocell or cluster. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In a patterning process, one or more alignment marks (such as substrate alignment marks $P_1$, $P_2$) guide placement of patterns onto a substrate W. In an embodiment of a patterning process (e.g., an integrated circuit manufacturing process), an alignment sensor AS (e.g., in combination with position sensor IF) determines a position of one or more alignment marks on substrate W (e.g., a semiconductor wafer) and adjusts the position of the substrate relative to a patterning device MA according to the determined locations of the alignment marks before pattern transfer in the lithographic apparatus. A misalignment of pattern in a device (e.g., an integrated circuit) can result in failure or degraded performance of the device and/or reduced yield of devices from a substrate W. For example, misaligned interconnections due to error in pattern placement can lead to reduced interconnection area at metal interconnections within a device and thus could increase electrical resistance in the device. So, improving pattern alignment of elements of a device can reduce manufacturing defects during a patterning process, and can increase device yield from a substrate W.

Similarly, one or more other metrology marks (e.g., used to determine overlay, CD, focus, dose, etc.) can also become degraded. And, thus, their measurement can also yield results that are incorrect and consequently, use of those results in control of patterning process can lead to failure or degraded performance of ae device and/or reduced yield of devices from a substrate W.

In an embodiment, one or more metrology marks (e.g., alignment marks) are formed on an object (such as a substrate W). In an embodiment, the one or more metrology marks are formed by creating a metrology mark pattern in a layer of resist on the object. In an embodiment, the metrology mark pattern in resist is transferred into material that underlays the resist. Etching can include plasma etching and/or wet chemical etching processing of a film in a stack of materials on the object. In an embodiment, one or more metrology marks are formed in at least a topmost non-resist layer of the object and persist in the topmost non-resist layer of the object after etching.

In an embodiment, one or more patterning process steps that follow formation of the metrology mark in the object, and that precede a next pattern transfer step to the object, degrade the metrology mark. For example, a metrology mark can be degraded by chemical mechanical polishing (CMP) of the object, leading to, e.g., loss of a part of the metrology mark, or deformation of at least part of the shape of the metrology mark. In an embodiment, a deformation of a metrology mark shape refers to corner rounding of the metrology mark, or to formation of a wavy, rather than straight, line of the metrology mark. In an embodiment, degradation of the metrology mark includes damage, distortion, and/or obscuration of the metrology mark. In an embodiment, a degraded mark includes a metrology mark that is incompatible with metrology system of a particular lithocell (e.g., the degraded mark may be designed for use with a metrology system from one vendor and is incompatible with a metrology system from another vendor). Reliance on a degraded metrology mark makes metrology steps, e.g., more time consuming, less accurate, and/or less reproducible. In an embodiment, a degraded metrology mark that is damaged, distorted, and/or obscured increases the likelihood that a patterning process will result in, e.g., misalignment of the transfer of a pattern with respect to a previously provided pattern (e.g., at a lower level) on the object.

A metrology mark may not be suitable for measurement using certain types of metrology. For example, in an embodiment, a first type of mark metrology, as used in a lithocell, is selected for one or more performance factors, such as mark detection speed and/or mark detection accuracy. In an embodiment, the first type of mark metrology may not be suitable for detecting a degraded metrology mark. In an embodiment, the first type of mark metrology includes a diffraction-based mark detection system.

So, in an embodiment, there is provided a tool or module, separate from the metrology tool (e.g., alignment sensor) of the lithocell (e.g., the lithographic apparatus), that is used to detect, using a second type of mark metrology, the degraded metrology mark, and then to create a replacement metrology mark (e.g., a new, substitute metrology mark, a repair of the metrology mark, an enhanced metrology mark (i.e., a mark that is different in design than the original metrology mark and will typically have better performance than the original), etc.) on the object. So, an object (having a degraded metrology mark) can still be processed by using the first type of mark metrology by using the first type of mark metrology to detect the replacement metrology mark on the object. The second type of mark metrology can be used to, for example, determine whether the degraded metrology mark is degraded and/or enable determining of an offset (if any) between the degraded replacement mark and the replacement metrology mark.

In an embodiment, instead of creating a replacement metrology mark, an offset can be determined for the existing degraded metrology mark via the measurement of the degraded metrology mark by the second type of mark metrology. This can be done, e.g., in circumstances where the degraded metrology mark is of sufficient quality for measurement using the first type of mark metrology of the lithocell. The offset provides a measure of an amount of error in the position as measured using the degraded metrology mark. The offset thus can provide a positional correction for when the degraded metrology mark is measured using the first type of mark metrology.

In an embodiment, the second type of mark metrology may not be suitable for use in the lithocell because of, e.g., a slower measurement speed relative to the first type of mark metrology. But, the second type of mark metrology is suitable for detecting a degraded metrology mark on the object.

In an embodiment, the second type of mark metrology is an optical method using non-visible radiation, such as infrared radiation, ultraviolet radiation, and/or x-ray radiation. In an embodiment, the second type of mark metrology is atomic force microscopy (AFM). In an embodiment, the second type of mark metrology employs visible light, but with a different field of view (i.e., using near field or other optical microscopy) than for the first type of mark metrology.

In an embodiment, the second type of mark metrology is a stack metrology that factors in the effect of one or more layers overlying or part of a metrology mark, which one or more layers cause a measurement using such a metrology mark to be inaccurate in measuring a "true" position. For example, the stack metrology can determine an apparent shift in a wavelength distribution (re-weighting) due to the one or more layers and/or an apparent shift in a numerical aperture distribution (re-weighting) due to the one or more layers. In an embodiment, the measured shift is of reflectivity. Using an appropriate calibration (e.g., of one or more reference substrates having known layers over a metrology mark), the apparent shift can be translated into a positional offset of the metrology mark when it is measured to determine a position. So, in an embodiment, like the other second types of mark metrology, the stack metrology can, for example, determine whether the degraded metrology mark is degraded and/or enable determining of an offset (if any) between the degraded replacement mark and the replacement metrology mark.

Figure 3:
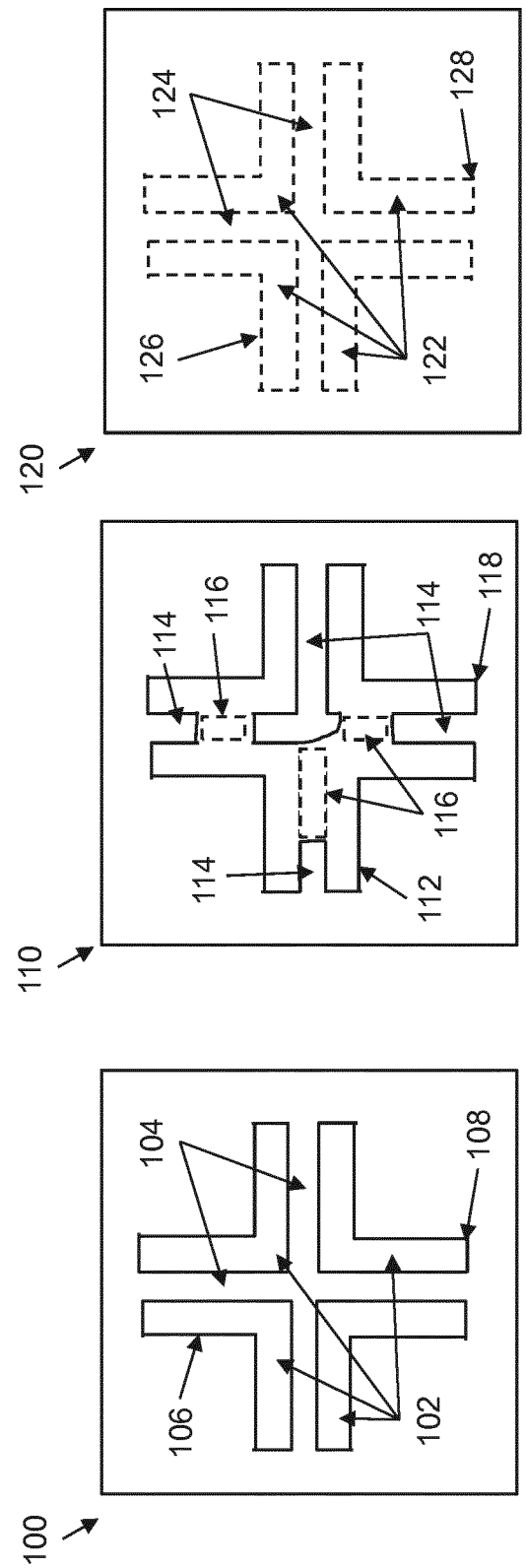
FIGS. 3A-3C schematically depict diagrams of an example metrology mark on an object in a patterning process, according to an embodiment.

Referring to FIG. 3A, a metrology mark 100 (in this case, an alignment mark) is schematically depicted in the form of an un-degraded metrology mark amenable to metrology with a metrology apparatus (e.g., alignment sensor AS) using a first type of mark metrology. In this example, metrology mark 100 comprises a recessed area 102 (in this case, a plurality of trenches 102) with a ridge portion 104 between each pair of trenches 102. Each trench 102 has straight sidewalls 106 and squared corners 108, as viewed from above the metrology mark.

Referring to FIG. 3B, a schematic depiction of a degraded metrology mark 110, based on metrology mark 100, exhibits missing pattern elements that makes metrology using the first type of metrology less reliable than for metrology mark 100. Degraded metrology mark 110 comprises a recessed area 112 and ridge portions 114 that extend inward toward a center of recessed area 112. In degraded metrology mark 110, ridge portions 114 are broken and formerly isolated trenches have merged into recessed area 112. Degraded metrology mark 110 has pattern-free regions 116 where parts of the ridge portions 114 broke away from the object. Sidewalls 118 of a degraded metrology pattern 110 are generally straight despite the damage to ridge portions 114. In an embodiment, the second type of mark metrology is capable of detecting and measuring (e.g., aligning to) a degraded metrology mark such as degraded metrology mark 110 because the second type of mark metrology, for example, (1) has a larger time period in order to perform mark detection and measurement, and/or (2) employs a different type of radiation and/or interaction with the metrology mark.

Referring to FIG. 3C, a schematic depiction of a metrology mark 120, based on metrology mark 100, is shown below a layer of obscuring material on top of the metrology mark. Trenches 122 and ridges 124, having straight sidewalls 126 and squared corners 128 are present in the metrology mark. An intervening layer of material (i.e., a layer between a metrology mark and a detector) sometimes obscures a metrology mark from types of metrology used in a lithocell, making metrology mark location more difficult. In an embodiment, a metrology mark that is obscured (i.e., difficult or impossible to detect) by a first type of metrology is detectable using a second type of metrology that penetrates through, or more deeply into, the object (e.g., one or more layers thereof). In an embodiment, a second type of metrology employing non-visible radiation such as infrared or x-ray radiation that penetrates into the object (e.g., one or more layers thereof) is able to detect and measurement an obscured mark such as metrology mark 120. Radiation penetrating the object (e.g., the intervening layer of material) is redirected differently at the location of metrology mark 120 than by material adjoining and/or surrounding metrology mark 120.

Figure 4:
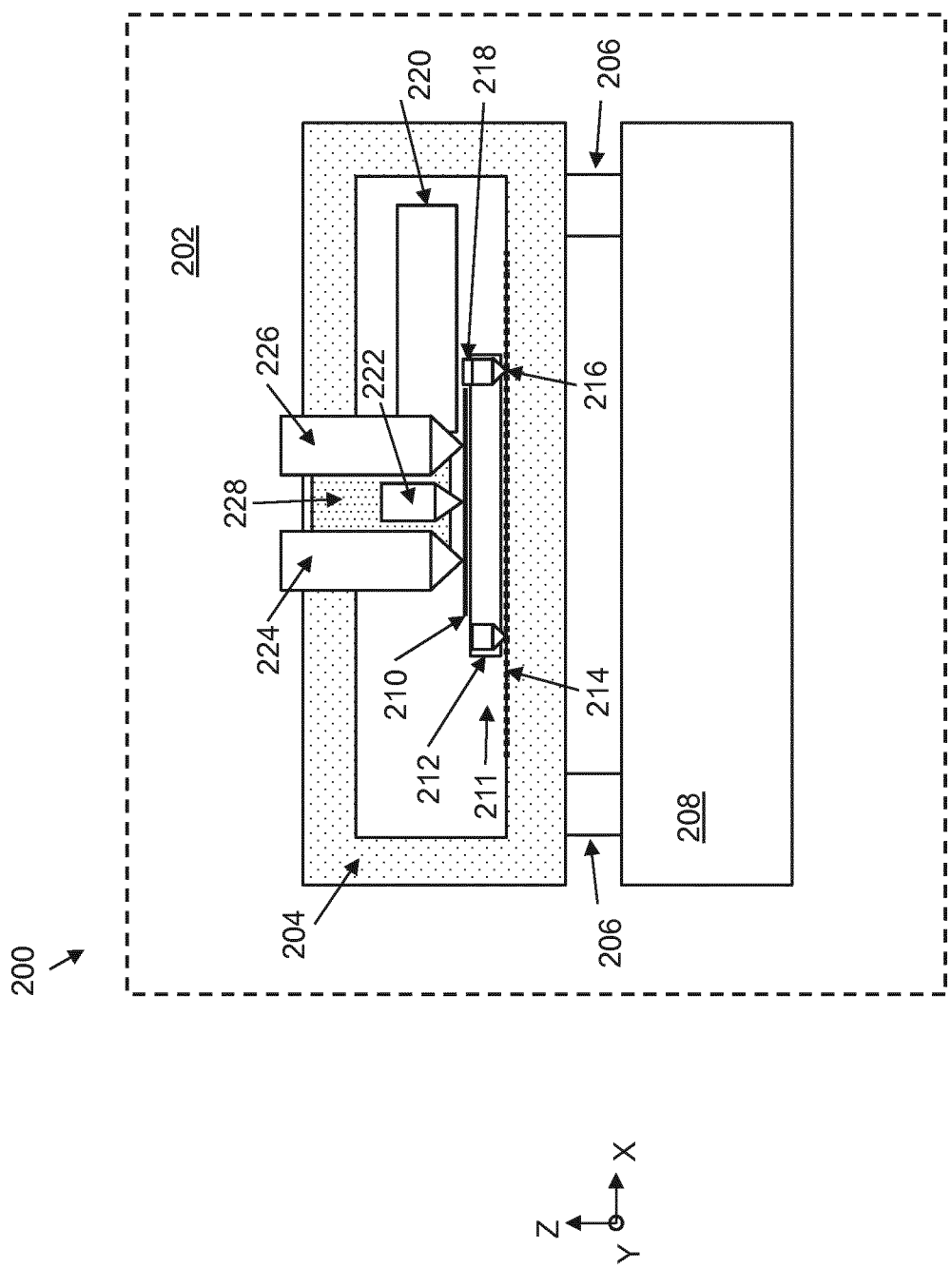
FIG. 4 schematically depicts a metrology mark module configured to detect a metrology mark on an object and provide a metrology mark on the object, according to an embodiment.

Referring to FIG. 4, a schematic diagram of a metrology mark module 200 used for detecting one or more metrology marks and other features on an object is shown. Metrology mark module 200 includes an environmental enclosure 202 that holds a frame 204 that is, for example, supported by vibrational isolation system 206 on a metrology base 208. In an embodiment, frame 204 supports a first metrology sensor 224 and/or an optional second metrology sensor 226. In an embodiment, frame 204 supports a mark printer 228. However, in an embodiment, mark printer 228 is supported on a separate frame that is mechanically isolated from frame 204.

Object 210 is supported on a stage 212 within frame 204. The position of the stage 212 is measured using a positional measurement system 211 (and accordingly, a control system of the metrology mark module 200 controls the position of the stage 212 using an output of the positional measurement system 211). In an embodiment, the positional measurement system 211 has a plurality of grid plate readers 216 configured to cooperate with a grid plate 214 over which the stage 212 is located as an encoder system to determine a position of the stage 212 within frame 204 relative to grid plate 214. As will be appreciated the grid plate 214 could be provided to the stage and the grid plate readers 216 could be provided to the frame 204. A different positional measurement system 211 (e.g., an interferometer) can be used.

Stage 212 includes one or more stage alignment markers 218 to enable determination of a position of stage 212 relative to one or more parts of the module (e.g., the position of stage 212 relative to mark printer 228) and/or to be used a reference relative to which the position of one or more metrology marks on the object are determined. For example, the alignment marker 218 can be used to determine a positional offset between the first metrology sensor 224 and the mark printer 228, between the first metrology sensor 224 and the second metrology sensor 226, etc.

Handler 220 receives and places object 210 on stage 212. A level sensor 222 measures a height and/or tilt of object 210 below a first metrology sensor 224, an optional second metrology sensor 226, and a mark printer 228.

In an embodiment, the first metrology sensor 224 is configured to detect and measure a degraded metrology mark with greater accuracy than a metrology tool (e.g., alignment sensor AS) of the lithocell for which the degraded metrology mark is designed for measurement. In an embodiment, the first metrology sensor 224 is configured to be readily replaceable (e.g., more readily replaceable than the second metrology sensor 226). This is so that a first metrology sensor 224 of different technology and/or capability can be provided responsive to the nature of the degradation of the metrology mark (e.g., the extent of damage, the presence of an intervening layer, etc.). For example, an appropriate first metrology sensor 224 having greater sensitivity to elements of a degraded metrology mark than a first metrology sensor 224 in the module 200 can be inserted. As another example, the first metrology sensor 224 can be one that uses illumination that originates from below the object (not shown in FIG. 4 for convenience), passes through the object and is detected by the sensor 224 at a position opposite, relative to the object, of the origin of the illumination. So, in an embodiment, the first metrology sensor 224 is of the second type of mark metrology. In an embodiment, the first metrology sensor 224 is an infrared detector, an ultraviolet radiation detector, and/or an x-ray detector. In an embodiment, the first metrology sensor 224 is an atomic force microscope or a near field optical microscope. In an embodiment, first metrology sensor 224 uses electrons or other particles to measure a metrology mark. In an embodiment, the metrology mark module 200 comprises two or more first metrology sensors 224, each configured to measure a degraded metrology mark with greater accuracy than a metrology tool (e.g., an alignment sensor AS) of the lithocell for which the degraded metrology mark is designed for measurement and in an embodiment, each of a different measuring type (e.g., one being infrared, while the other being ultraviolet).

A mark printer 228 is configured to create a replacement metrology mark on an object when a degraded metrology mark is present. In an embodiment, creating a replacement metrology mark involves adding material to an object surface (e.g., to a layer of material on the object). In an embodiment, the added material is added in module 200 (e.g., by object handler 220 and/or mark printer 228). In an embodiment, the added material for creating the replacement metrology mark can be added to either the top side of the object, the bottom of the object, or both the top and bottom sides during a mark creation process. In an embodiment, mark material is deposited directly onto an object surface. Some objects have a layer of resist and/or a layer of anti-reflective coating (ARC), into which a metrology mark can be created or on which a metrology mark can be created using mark material deposited thereon.

In an embodiment, a replacement metrology mark can be formed by a subtractive process. In an embodiment, the subtractive process can use mark material deposited (e.g., specially deposited for the mark printer 228) on the object for creating the replacement metrology mark or use an existing surface (e.g., a layer of resist) on the object. In an embodiment, an example subtractive process is an optical process, such as exposing an unexposed layer of radiation-sensitive material to radiation so as to modify a chemical structure of a portion of the material, the portion corresponding to the pattern of the replacement metrology mark. A subsequent developing process of the layer of material removes one portion of the layer of material and leaves the pattern corresponding to the replacement metrology mark on the object. In an embodiment, the subtractive process is an ablation process using radiation to mechanically remove material to form the replacement metrology mark.

In an embodiment, a replacement metrology mark can be formed by an additive process. In an embodiment, mark material that is added to the object as described above is added in the form of the pattern of the replacement metrology mark. In an embodiment, the additive process uses an inkjet-type dispenser to dispense the added material in the form of the replacement metrology mark pattern.

In an embodiment, a replacement metrology mark can be formed by shaping material on the object. In an embodiment, a probe tip is brought into close proximity to the surface of the material to distort the surface, using, e.g., van der Waals forces, leaving a physically-modified surface behind the probe tip as the probe tip moves across the surface. In an embodiment, the material is resist, e.g., developed resist.

In an embodiment, a replacement metrology mark is formed by pressing a mold into a surface of material on the object, leaving an impression in the material after the mold is removed from the surface of the layer of material. In an embodiment, the material is resist, e.g., developed resist.

In an embodiment, the mark printer 228 is configured to provide the replacement metrology mark in a known offset relative to, for example, the degraded metrology mark and/or to a device pattern feature. In an embodiment, a control system of the metrology mark module 200 enables this by, for example, measurement of a location of the degraded metrology mark using the first metrology sensor 224 (which works in cooperation with the positional measurement system 211 to determine the position of the degraded metrology mark in the coordinate system of the metrology mark module 200). In an embodiment, a control system of the metrology mark module 200 enables this by, for example, measurement of a location of a device pattern feature (e.g., a critical device pattern feature, e.g., one important to the functionality of the device and/or susceptible to a defect where overlay is not accurate) using the first metrology sensor 224 (which works in cooperation with the positional measurement system 211 to determine the position of the device pattern feature in the coordinate system of the metrology mark module 200). The control system controls the position of the object 210 using the positional measurement system 211 relative to the mark printer 228 so that the mark printer 228 can create the replacement metrology mark at the offset.

In an embodiment, an optional second metrology sensor 226 is configured to measure the replacement metrology mark. In an embodiment, the second metrology sensor 226 is different from the first metrology sensor 224. In an embodiment, the second metrology sensor 226 is a diffraction-based sensor. In an embodiment, the second metrology sensor is a same or similar type of sensor as a metrology tool (e.g., an alignment sensor) of the lithocell for which the degraded mark is designed for measurement. So, in an embodiment, the second metrology sensor 226 is of the first type of mark metrology.

In an embodiment, the metrology mark module 200 can enable features in addition to or alternatively to replacement mark creation. For example, it can provide tool-to-tool alignment/overlay matching. That is, in an embodiment, it can enable matching of overlay/alignment between two or more lithographic apparatuses since the metrology mark module 200 has a metrology sensor. For example, it can measure overlay for one lithographic apparatus and similarly measure the overlay from another lithographic apparatus and determine an offset so that the two lithographic apparatuses can produce comparable overlays. In an embodiment, the metrology mark module 200 can produce an overlay/alignment fingerprint across a substrate to enable the matching.

In an embodiment, the metrology mark module 200 can enable calibration of another metrology system (e.g., the alignment sensor AS) in the lithocell. It can be used to determine, for example, process variation sensitivities of the other metrology system in the lithocell.

In an embodiment, the metrology mark module 200 can provide back-side metrology of the object without having to turn the object over, where the one or more metrology systems in the lithocell otherwise don't provide back-side metrology of the object without turning over the object.

FIGS. 5A-5D schematically depict cross-sectional views of examples of an object with a metrology mark and a replacement metrology mark.

Referring to FIG. 5A, an object 300 having a layer 302 (in an embodiment, the layer 302 is an underlying substrate such as a silicon wafer) with a metrology mark 304 has a replacement metrology mark 306 formed in the layer 302 of the object and/or has a replacement metrology mark 308 formed on the layer 302 of the object. In an embodiment, the replacement metrology mark 306 is a subtractive mark formed in the top surface of the layer 302. In an embodiment, the replacement metrology mark 308 is an additive mark formed at the top surface of the layer 302.

Referring to FIG. 5B, an object 310 having a layer 312 (in an embodiment, the layer 312 is an underlying substrate such as a silicon wafer) with a metrology mark 314 in layer 312 is shown with a replacement metrology mark 316 formed in a coating layer 318 on the top surface of the layer 312. In an embodiment, the coating layer 318 comprises a layer of anti-reflective coating (ARC), and/or a layer of resist on layer 312. Replacement metrology mark 316 can be, formed, by a subtractive process or a shaping process.

Referring to FIG. 5C, an object 320 having a layer 322 (in an embodiment, the layer 322 is an underlying substrate such as a silicon wafer) with a metrology mark 304 has a replacement metrology mark 326 formed in a coating layer 324 on the top layer 322 of the object. Coating layer 324 and replacement metrology mark 326 are covered by a second coating layer 328. In an embodiment, the coating layer 324 is an ARC and the second coating layer 326 is a resist layer for receiving a pattern for a layer of a device.

Referring to FIG. 5D, an object 330 having a layer 332 (in an embodiment, the layer 332 is an underlying substrate such as a silicon wafer) with coating layers 334 and 335 has a replacement metrology mark 336 located in a backside coating layer 338 on a back side 340 of the object 330. As with replacement metrology marks 306, 316, and 326, replacement metrology mark 336 can be formed additively, subtractively, or by reshaping a coating layer of material on an object.

Figure 6:
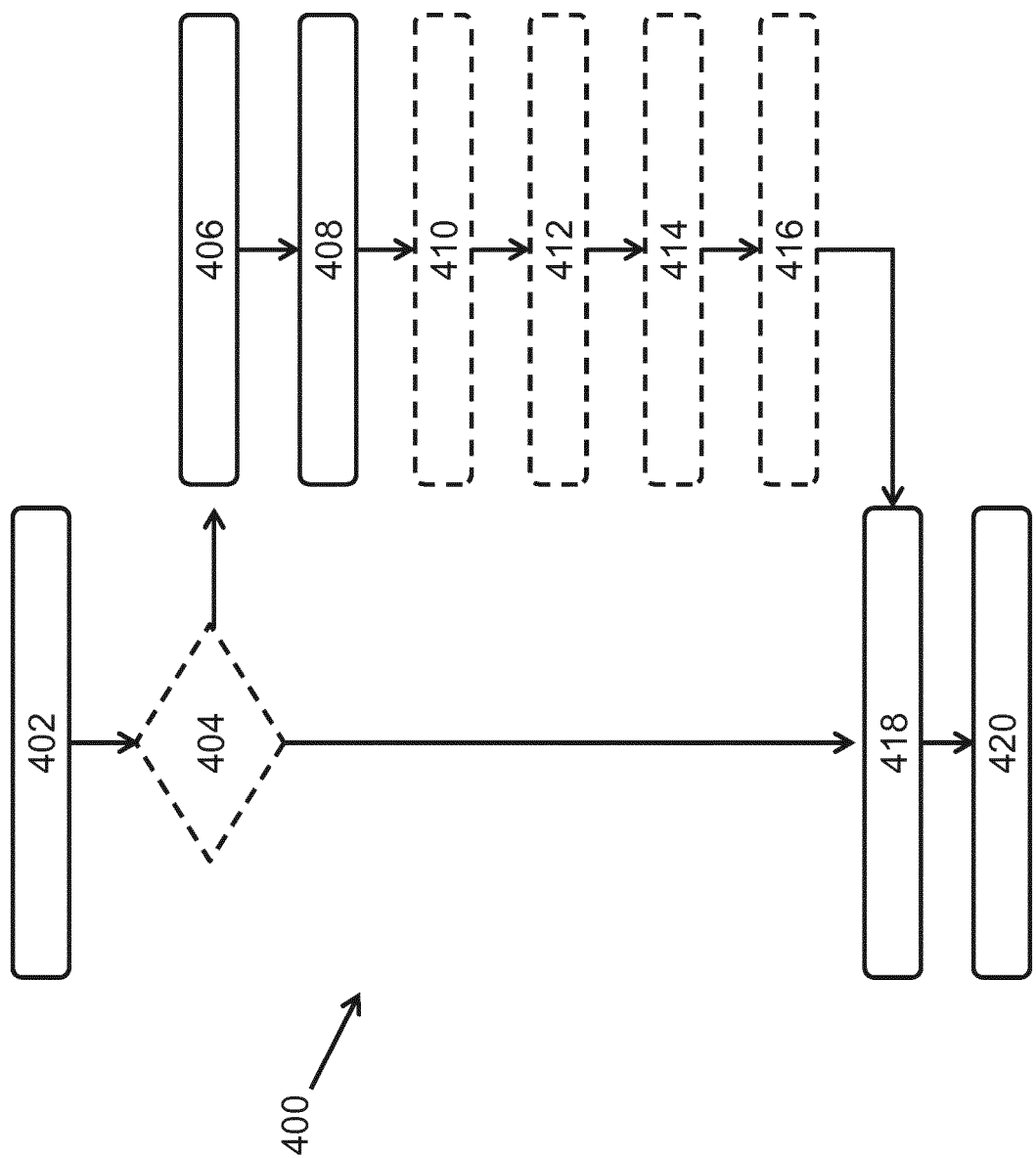
FIG. 6 is a flow diagram of a processing method, according to an embodiment.

FIG. 6 is a flow diagram of a method of patterning an object, according to an embodiment. A method 400 includes an operation 402, wherein a metrology mark is inspected with an inspection apparatus. In an embodiment, the metrology mark is measured using a second type of mark metrology (e.g. using the first metrology sensor 224) as discussed above. The second type of mark metrology includes, according to some embodiments, infrared imaging, visible light imaging, ultraviolet radiation imaging, or x-ray imaging. In an embodiment, the second type of mark metrology includes a form of microscopy, such as atomic force microscopy or near field microscopy. In an embodiment, the second type of mark metrology includes a particle-based detection system.

In an embodiment, an image of the metrology mark can be recorded using, e.g., the first metrology sensor 224, a camera, etc.

The method 400 optionally includes operation 404, wherein it is determined whether one or more metrology marks on the object are degraded. In an embodiment, a determination of whether a metrology mark is degraded can be achieved by evaluating line straightness, the shape of a metrology mark, and/or whether features of the metrology mark are missing in a measured image of the metrology mark. In an embodiment, the determination of whether a metrology mark is degraded can be made by analyzing measurements results of the first metrology sensor 224, e.g., determining a relative location as measured by the first metrology sensor 224 with an expected location of the metrology mark. Determination is, in an embodiment, a fully automated process using a processing algorithm to detect factors relating to mark quality, and/or a processing involving a human interaction to confirm the quality of a metrology mark. Following performance of operation 404, operation 406 is next performed on an object having a degraded metrology mark, while operation 418 is next performed on an object having a metrology mark determined not be degraded. Metrology marks could be treated as degraded and the operation 406 and subsequent could be executed on one or more of the metrology marks on the object.

At operation 406, an object is subjected to an object mark detection process using a second type of mark metrology (which is different than a type of mark metrology in the lithocell used to measure the degraded metrology mark). As will be appreciated, the types of mark metrology used in the lithocell or in the separate metrology mark module 200 are selected according to parameters relating to the use of such apparatus or modules in a manufacturing environment. Factors relating to the selection of one mark metrology in a module include time constraints, mark detection accuracy and/or reproducibility, maintenance and calibration of the metrology apparatus, and so forth. Mark metrology used in the lithocell will tend to have a shorter measurement and/or analysis time than the second type of metrology used in a standalone metrology mark module, such as metrology mark module 200. The second type of mark metrology used in a standalone metrology mark module, such as metrology mark module 200, can have simpler maintenance requirements and/or can be replaced more easily (fewer hours worked, as well as quicker stabilization times following maintenance) than metrology used in the lithocell for which the degraded metrology mark is designed and typically measured.

In an embodiment, operation 406 is performed in an apparatus (or a portion of an apparatus) separate from the measurement system of a lithocell for which the degraded alignment mark is designed. So, in an embodiment, operation 406 is performed in a standalone metrology mark module, such as metrology mark module 200 provided in a stand-alone format. In an embodiment, the operation 406 is performed in an in-track metrology mark module, such as metrology mark module 200 as part of a track. In an embodiment, operation 406 is performed in a part of a lithographic apparatus separate from the measurement apparatus in the lithographic apparatus for which the degraded metrology mark is designed for use with, such as metrology mark module 200 as part of a lithographic apparatus separate from the alignment sensor AS.

The metrology mark module can be configured to have, in addition to a sensor compatible with the second type of mark metrology, one or more sensors suitable for other types of metrology. The metrology mark module can be configured, in an embodiment, to have multiple stations wherein metrology takes place in one station and mark repair/replacement takes place at another station, to compensate for slower types of mark metrology in the module, and/or the use of multiple different second types of mark metrology.

In an embodiment, the object mark detection process includes locating the degraded metrology mark using the second type of mark metrology and measuring the degraded metrology mark. In an embodiment, the object mark detection process can use measurement results from operation 402 where operation 402 involves using a second type of mark metrology. In an embodiment, the object mark detection process can make measurements using a metrology system using the second type of mark metrology, such as the first metrology sensor 224.

At operation 408, after the degraded metrology mark is detected, a replacement metrology mark (e.g., an enhanced metrology mark, or a new metrology mark) is created on a surface of the object. In an embodiment, the replacement metrology mark is created at a metrology mark location at a certain offset distance from the location of the degraded metrology mark. As will be appreciated, creating the replacement metrology mark at a distance from the location of the degraded metrology mark avoids confusing features of the replacement metrology mark with mark features from the degraded metrology mark. In an embodiment, the replacement metrology mark is created at a known offset from, e.g., the degraded metrology mark and/or from a device pattern feature. This can be done, e.g., by aligning the degraded metrology mark using the first metrology sensor 224 and then using a mark printer 228 at a known offset from the first metrology sensor 224 to provide the replacement metrology mark. This can be done, e.g., by measuring a position of a device pattern feature (e.g., a critical device pattern feature) using the first metrology sensor 224 and then using a mark printer 228 at a known offset from first metrology sensor 224 to provide the replacement metrology mark. Or, in an embodiment, the position of the degraded metrology mark and/or a device pattern feature can be determined using the first metrology sensor 224 and then a relative displacement between the object and the mark printer 228 can be made so as to provide the replacement metrology mark by the mark printer 228 at a certain known offset. In an embodiment, the replacement metrology mark is located directly over the location of the degraded metrology mark (and thus zero offset relative to the degraded metrology mark but at a certain offset from a device pattern feature).

In an embodiment, a replacement metrology mark may not be created if the degraded alignment mark exhibits reproducibility but inadequate accuracy. In that case, a corrective data record can be produced at operation 408 to enable better measurement using a metrology system of the first type in the lithocell. For example, the data record can have data regarding a positional error (e.g., determined using stack metrology, a positional error of the degraded metrology mark relative to a device pattern feature (which can be determined, e.g., by comparing a position of the degraded metrology mark measured by second type of mark metrology relative to a device pattern to a known position of the degraded mark relative to the device pattern), etc.), mark structural asymmetry, information regarding a measurement beam wavelength to be used for measuring the degraded metrology mark, information regarding a measurement beam numerical aperture or measurement beam illumination radiation spatial or angular distribution for measuring the degraded metrology mark, etc.

At an optional operation 410, the replacement metrology mark is measured in the metrology mark module using the first type of metrology (see, e.g., the second metrology sensor 226 in metrology mark module 200 of FIG. 4) as described above. In an embodiment, the first type of metrology can be used to help ensure that the replacement metrology mark is readable by a metrology system that is the same as, or similar to, the metrology tool (e.g., alignment sensor) in the lithocell for which the degraded metrology mark is designed. In an embodiment, the first type of metrology can be used to determine the location of the replacement metrology mark and to, e.g., determine the offset between the replacement metrology mark and the degraded metrology mark/device pattern feature. This can be done by, for example, determining the location of the replacement metrology mark with the first type of metrology relative to a reference (such as an alignment marker 218, a device pattern feature, etc.), wherein the second type of metrology determined the location of the degraded metrology mark relative to the same reference (or another reference with a known position relative to the reference for the second type of metrology).

The method 400 may optionally include an operation 412, wherein a corrective offset is determined based on an actual measured location of the replacement metrology mark (e.g., determined in operation 410), which can be combined with a known offset (e.g., from operation 408) of the replacement metrology mark. Thus, an improved determination of the offset permits improvement of alignment for the object based on the replacement metrology mark in a lithography apparatus.

The method 400 may also optionally include creating, by the metrology mark module, a data record that includes a location of the replacement metrology mark and/or an offset for the replacement metrology mark (which can include, e.g., a known offset, a combination of a known offset with a corrective offset, a measured offset, etc.). Optionally, the data record can include an identifier for the object and/or a location of the metrology mark. In an embodiment, a reference code can be printed (e.g., by the mark printer 228) on the object that can include data record data and/or provide a reference to locate and/or access data record data. The reference code can be read by a reader device in the lithocell. In an embodiment, the reference code comprises a bar code. The method 400 may also optionally comprise an operation 416, wherein the data record is transmitted from the metrology mark module to a lithography apparatus and stored in the lithography apparatus prior to transferring a pattern to the object in the lithography apparatus. The lithography apparatus uses data of the data record to control its operation using the replacement metrology mark.

The method 400 further includes an operation 418, wherein the object is measured (e.g., aligned) in a lithography apparatus using the replacement metrology mark. The method 400 further comprises operation 420, wherein a pattern is transferred, by the patterning device, to the object (or, to a film of resist) located thereon based on a measurement made in the lithography apparatus using the replacement metrology mark.

In an embodiment, there is provided a method comprising: subsequent to a first device lithographic step of a device patterning process, measuring a degraded metrology mark on an object and/or a device pattern feature associated with the degraded metrology mark, the degraded metrology mark arising at least in part from the first device lithographic step on the object; and prior to a second device lithographic step of the device patterning process on the object, creating a replacement metrology mark, for use in the patterning process in place of the degraded metrology mark, on the object.

In an embodiment, the method further comprises measuring, using a metrology step, the replacement metrology mark on the object prior to the second device lithographic step. In an embodiment, the method comprises measuring the degraded metrology mark and measuring the degraded metrology mark comprises measuring the degraded metrology mark by a first type of metrology, and wherein measuring the replacement metrology mark comprises measuring the replacement metrology mark by a second type of metrology different from the first type of metrology. In an embodiment, the method comprises measuring the degraded metrology mark and measuring the degraded metrology mark comprises measuring the degraded metrology mark by a first type of metrology and wherein the second device lithographic step uses a second type of metrology different from the first type of metrology to measure the replacement metrology mark. In an embodiment, the first and second types of metrology are first and second types of alignment metrology. In an embodiment, the first type of metrology comprises a stack metrology to determine a positional error of the degraded metrology mark due to one or more layers on or of the degraded metrology mark. In an embodiment, creating the replacement metrology mark comprises creating the replacement metrology mark at a distance offset. In an embodiment, the method further comprises creating a data record for use in the patterning process when measuring the replacement mark, the data record having an identifier of the object and the distance offset of the replacement metrology mark. In an embodiment, the method comprises measuring a position of the degraded metrology mark relative to a device pattern feature and wherein the distance offset comprises a distance offset of the replacement metrology mark relative to the device pattern feature. In an embodiment, creating the replacement metrology mark includes performing an optical process and/or a physical process on the object. In an embodiment, creating the replacement metrology mark includes creating the replacement metrology mark on a same side of the object as the degraded metrology mark. In an embodiment, creating the replacement metrology mark includes creating the replacement metrology mark on a different side of the object from the degraded metrology mark. In an embodiment, creating the replacement metrology mark comprises adding a mark material to a surface of the object. In an embodiment, creating the replacement metrology mark comprises removing object material and/or a portion of a layer of resist on the object. In an embodiment, the degraded metrology mark and the replacement metrology marks are alignment marks. In an embodiment, the method further comprises measuring the replacement metrology mark of the object as part of the second device lithographic step; and transferring a pattern to the object based on the measurement of the replacement metrology mark. In an embodiment, transferring the pattern to the object includes performing a photolithography process. In an embodiment, the object is a semiconductor substrate.

In an embodiment, there is provided an apparatus, comprising: a metrology sensor configured to measure a degraded metrology mark on an object subsequent to a first device lithographic step of a device patterning process and/or measure a device pattern feature associated with the degraded metrology mark, the degraded metrology mark arising at least in part from the first device lithographic step on the object; and a mark application device configured to create a replacement metrology mark on the object prior to any subsequent device lithographic step of the device patterning process, wherein the replacement mark is used in the patterning process in place of the degraded metrology mark.

In an embodiment, the mark application device is configured to apply the replacement mark without applying a device pattern. In an embodiment, the metrology sensor is an alignment sensor configured to determine a position of the degraded metrology mark. In an embodiment, the apparatus comprises a further metrology sensor configured to measure the replacement metrology mark according to a second type of mark metrology different from a first type of mark metrology used by the metrology sensor to measure the degraded metrology mark.

In an embodiment, there is provided an apparatus, comprising: a first metrology sensor configured to measure a degraded metrology mark on the object according to a first type of mark metrology; a mark application device configured to apply, based on the measurement of the degraded mark, a replacement metrology mark on the object; and a second metrology sensor configured to measure the replacement metrology mark according to a second type of mark metrology different from the first type of mark metrology.

In an embodiment, the first metrology sensor is configured to measure the degraded metrology mark subsequent to a first device lithographic step of a device patterning process on the object, and the mark application device is configured to apply replacement metrology mark prior to a second device lithographic step of the device patterning process on the object. In an embodiment, the first type of mark metrology is based on infrared radiation, visible light, ultraviolet radiation, and/or x-ray radiation. In an embodiment, the first type of mark metrology comprises scanning electron microscopy, tunneling electron microscopy, atomic force microscopy, confocal microscopy, and/or near field optical microscopy. In an embodiment, the first and second types of metrology are first and second types of alignment metrology. In an embodiment, the mark application device is configured to create the replacement mark by an additive process on the object, by removing object material and/or a portion of a layer of resist on the object, by optically transforming material on the object, and/or by imprinting material on the object. In an embodiment, the mark application device is configured to create the replacement mark at a distance offset from the degraded metrology mark. In an embodiment, the apparatus further comprises a computer system configured to create a data record for use in the patterning process when measuring the replacement mark, the data record having an identifier of the object and the distance offset of the replacement metrology mark. In an embodiment, the mark application device is configured to create the replacement metrology mark on a same side of the object as the degraded metrology mark. In an embodiment, the mark application device is configured to create the replacement metrology mark on a different side of the object from the degraded metrology mark. In an embodiment, the degraded metrology mark and the replacement metrology marks are alignment marks. In an embodiment, the apparatus further comprises a lithographic apparatus configured to measure the replacement metrology mark of the object as part of a lithographic step of the patterning process and to transfer a pattern to the object based on the measurement of the replacement metrology mark. In an embodiment, the object is a semiconductor substrate.

As will be appreciated by one of ordinary skill in the art, the present application may be embodied as a system, method, or computer program product. Accordingly, aspects of the present application may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present application may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable medium would include the following: an electrical connection having one or more wires, a portable computer diskette, a hard disk, a random access memory (RAM), a read-only memory (ROM), an erasable programmable read-only memory (e.g. EPROM or Flash memory), an optical fiber, a portable compact disc read-only memory CDROM, an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency RF, etc., or any suitable combination thereof.

Computer program code for carrying out operations for aspects of the present application may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network LAN or a wide area network WAN, or the connection may be made to an external computer (for example, through the Internet using an Internet Service Provider).

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing one or more of the functions/acts specified herein.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments may be implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

Figure 7:
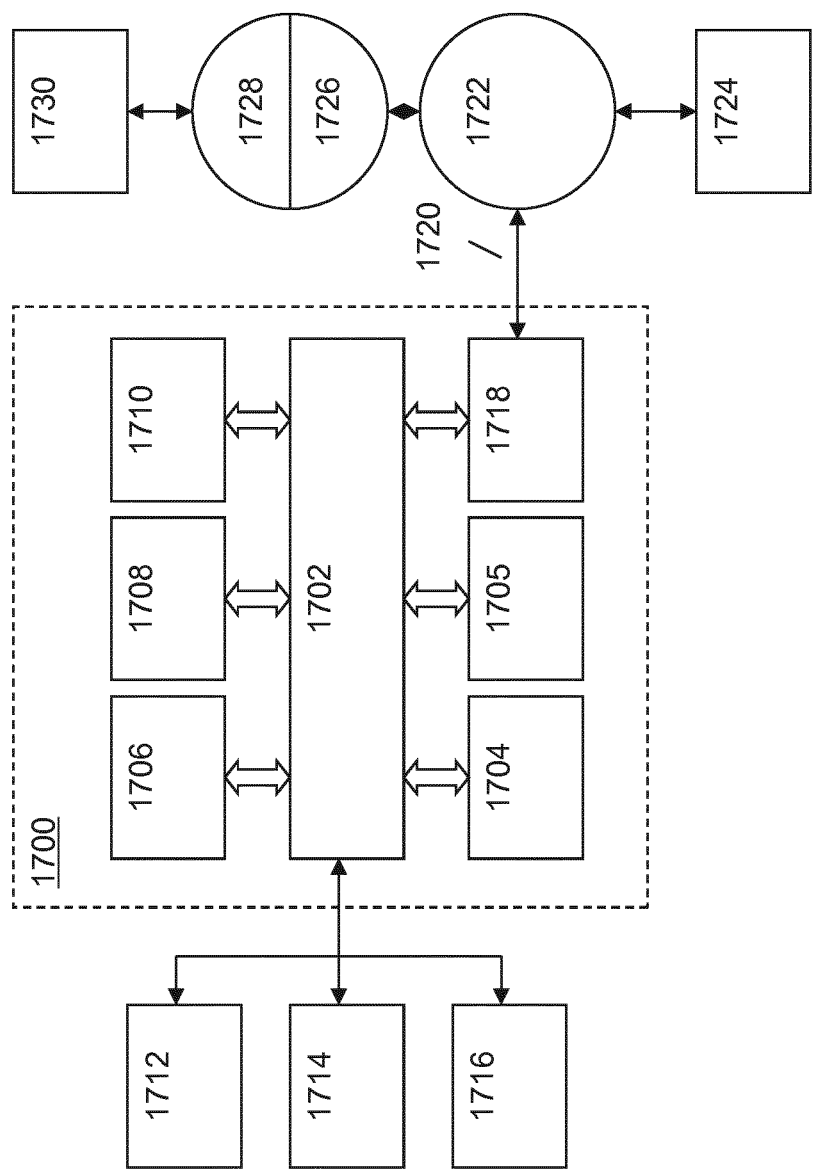
FIG. 7 illustrates a block diagram of an example computer system.

FIG. 7 shows a block diagram that illustrates an embodiment of a computer system 1700 which can assist in implementing any of the methods and flows disclosed herein. Computer system 1700 includes a bus 1702 or other communication mechanism for communicating information, and a processor 1704 (or multiple processors 1704 and 1705) coupled with bus 1702 for processing information. Computer system 1700 also includes a main memory 1706, such as a random access memory RAM or other dynamic storage device, coupled to bus 1702 for storing information and instructions to be executed by processor 1704. Main memory 1806 also may be used for storing temporary variables or other intermediate information during execution of instructions to be executed by processor 1704. Computer system 1700 further includes a read only memory ROM 1708 or other static storage device coupled to bus 1702 for storing static information and instructions for processor 1704. A storage device 1710, such as a magnetic disk or optical disk, is provided and coupled to bus 1702 for storing information and instructions.

Computer system 1700 may be coupled via bus 1702 to a display 1712, such as a cathode ray tube (CRT) or flat panel or touch panel display for displaying information to a computer user. An input device 1714, including alphanumeric and other keys, is coupled to bus 1702 for communicating information and command selections to processor 1704. Another type of user input device is cursor control 1716, such as a mouse, a trackball, or cursor direction keys for communicating direction information and command selections to processor 1704 and for controlling cursor movement on display 1712. This input device typically has two degrees of freedom in two axes, a first axis (e.g. x) and a second axis (e.g. y), that allows the device to specify positions in a plane. A touch panel (screen) display may also be used as an input device.

According to one embodiment, portions of a process described herein may be performed by computer system 1700 in response to processor 1704 executing one or more sequences of one or more instructions contained in main memory 1706. Such instructions may be read into main memory 1706 from another computer-readable medium, such as storage device 1710. Execution of the sequences of instructions contained in main memory 1706 causes processor 1704 to perform the process steps described herein. One or more processors in a multi-processing arrangement may also be employed to execute the sequences of instructions contained in main memory 1706. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 1704 for execution. Such a medium may take many forms, including but not limited to, non-volatile media, volatile media, and transmission media. Non-volatile media include, for example, optical or magnetic disks, such as storage device 1710. Volatile media include dynamic memory, such as main memory 1706. Transmission media include coaxial cables, copper wire and fiber optics, including the wires that comprise bus 1702. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 1704 for execution. For example, the instructions may initially be borne on a magnetic disk of a remote computer. The remote computer can load the instructions into its dynamic memory and send the instructions over a telephone line using a modem. A modem local to computer system 1700 can receive the data on the telephone line and use an infrared transmitter to convert the data to an infrared signal. An infrared detector coupled to bus 1702 can receive the data carried in the infrared signal and place the data on bus 1702. Bus 1702 carries the data to main memory 1706, from which processor 1704 retrieves and executes the instructions. The instructions received by main memory 1706 may optionally be stored on storage device 1710 either before or after execution by processor 1704.

Computer system 1700 may also include a communication interface 1718 coupled to bus 1702. Communication interface 1718 provides a two-way data communication coupling to a network link 1720 that is connected to a local network 1722. For example, communication interface 1718 may be an integrated services digital network ISDN card or a modem to provide a data communication connection to a corresponding type of telephone line. As another example, communication interface 1718 may be a local area network LAN card to provide a data communication connection to a compatible LAN. Wireless links may also be implemented. In any such implementation, communication interface 1718 sends and receives electrical, electromagnetic or optical signals that carry digital data streams representing various types of information.

Network link 1720 typically provides data communication through one or more networks to other data devices. For example, network link 1720 may provide a connection through local network 1722 to a host computer 1724 or to data equipment operated by an Internet Service Provider ISP 1726. ISP 1726 in turn provides data communication services through the worldwide packet data communication network, now commonly referred to as the "Internet" 1728. Local network 1722 and Internet 1728 both use electrical, electromagnetic or optical signals that carry digital data streams. The signals through the various networks and the signals on network link 1720 and through communication interface 1718, which carry the digital data to and from computer system 1700, are exemplary forms of carrier waves transporting the information.

Computer system 1700 can send messages and receive data, including program code, through the network(s), network link 1720, and communication interface 1718. In the Internet example, a server 1730 might transmit a requested code for an application program through Internet 1728, ISP 1726, local network 1722 and communication interface 1718. One such downloaded application may provide for a method or portion thereof as described herein, for example. The received code may be executed by processor 1704 as it is received, and/or stored in storage device 1710, or other non-volatile storage for later execution. In this manner, computer system 1700 may obtain application code in the form of a carrier wave.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle"/"mask", "wafer" or "die" in this text should be considered as interchangeable with the more general terms "patterning device", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

While the concepts disclosed herein may be used with systems and methods for imaging on a substrate such as a silicon wafer, it shall be understood that the disclosed concepts may be used with any type of lithographic systems, e.g., those used for imaging on substrates other than silicon wafers.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims.

Modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the"

include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

In an embodiment, there is provided a method comprising: subsequent to a first device lithographic step of a device patterning process, measuring a degraded metrology mark on an object and/or a device pattern feature associated with the degraded metrology mark, the degraded metrology mark arising at least in part from the first device lithographic step on the object; and prior to a second device lithographic step of the device patterning process on the object, creating a replacement metrology mark, for use in the patterning process in place of the degraded metrology mark, on the object.

In an embodiment, the method further comprises measuring, using a metrology step, the replacement metrology mark on the object prior to the second device lithographic step. In an embodiment, the method comprises measuring the degraded metrology mark and measuring the degraded metrology mark comprises measuring the degraded metrology mark by a first type of metrology, and wherein measuring the replacement metrology mark comprises measuring the replacement metrology mark by a second type of metrology different from the first type of metrology. In an embodiment, the method comprises measuring the degraded metrology mark and measuring the degraded metrology mark comprises measuring the degraded metrology mark by a first type of metrology and wherein the second device lithographic step uses a second type of metrology different from the first type of metrology to measure the replacement metrology mark. In an embodiment, the first and second types of metrology are first and second types of alignment metrology. In an embodiment, the first type of metrology comprises a stack metrology to determine a positional error of the degraded metrology mark due to one or more layers on or of the degraded metrology mark. In an embodiment, creating the replacement metrology mark comprises creating the replacement metrology mark at a distance offset. In an embodiment, the method further comprises creating a data record for use in the patterning process when measuring the replacement mark, the data record having an identifier of the object and the distance offset of the replacement metrology mark. In an embodiment, the method comprises measuring a position of the degraded metrology mark relative to a device pattern feature and wherein the distance offset comprises a distance offset of the replacement metrology mark relative to the device pattern feature. In an embodiment, creating the replacement metrology mark includes performing an optical process and/or a physical process on the object. In an embodiment, creating the replacement metrology mark comprises adding a mark material to a surface of the object. In an embodiment, creating the replacement metrology mark comprises removing object material and/or a portion of a layer of resist on the object. In an embodiment, the degraded metrology mark and the replacement metrology marks are alignment marks. In an embodiment, the method further comprises measuring the replacement metrology mark of the object as part of the second device lithographic step; and transferring a pattern to the object based on the measurement of the replacement metrology mark.

In an embodiment, there is provided an apparatus, comprising: a metrology sensor configured to measure a degraded metrology mark on an object subsequent to a first device lithographic step of a device patterning process and/or measure a device pattern feature associated with the degraded metrology mark, the degraded metrology mark arising at least in part from the first device lithographic step on the object; and a mark application device configured to create a replacement metrology mark on the object prior to any subsequent device lithographic step of the device patterning process, wherein the replacement mark is used in the patterning process in place of the degraded metrology mark.

In an embodiment, the mark application device is configured to apply the replacement mark without applying a device pattern. In an embodiment, the metrology sensor is an alignment sensor configured to determine a position of the degraded metrology mark. In an embodiment, the apparatus comprises a further metrology sensor configured to measure the replacement metrology mark according to a second type of mark metrology different from a first type of mark metrology used by the metrology sensor to measure the degraded metrology mark.

In an embodiment, there is provided an apparatus, comprising: a first metrology sensor configured to measure a degraded metrology mark on the object according to a first type of mark metrology; a mark application device configured to apply, based on the measurement of the degraded mark, a replacement metrology mark on the object; and a second metrology sensor configured to measure the replacement metrology mark according to a second type of mark metrology different from the first type of mark metrology.

In an embodiment, the first metrology sensor is configured to measure the degraded metrology mark subsequent to a first device lithographic step of a device patterning process on the object, and the mark application device is configured to apply replacement metrology mark prior to a second device lithographic step of the device patterning process on the object. In an embodiment, the first type of mark metrology is based on infrared radiation, visible light, ultraviolet radiation, and/or x-ray radiation. In an embodiment, the first type of mark metrology comprises scanning electron microscopy, tunneling electron microscopy, atomic force microscopy, confocal microscopy, and/or near field optical microscopy. In an embodiment, the mark application device is configured to create the replacement mark by an additive process on the object, by removing object material and/or a portion of a layer of resist on the object, by optically transforming material on the object, and/or by imprinting material on the object. In an embodiment, the mark application device is configured to create the replacement mark at a distance offset from the degraded metrology mark. In an embodiment, the apparatus further comprises a computer system configured to create a data record for use in the patterning process when measuring the replacement mark, the data record having an identifier of the object and the distance offset of the replacement metrology mark. In an embodiment, the apparatus further comprises a lithographic apparatus configured to measure the replacement metrology mark of the object as part of a lithographic step of the patterning process and to transfer a pattern to the object based on the measurement of the replacement metrology mark.

The description of the present application has been presented for purposes of illustration and description, and is not intended to be exhaustive or limiting of the invention in the form disclosed. Many modifications and variations will be apparent to those of ordinary skill in the art. Thus, it will be apparent to one skilled in the art that modifications may be made as described without departing from the scope of the claims set out below.

What is claimed is:

1. A method comprising:
   subsequent to a first device lithographic step of a device patterning process, obtaining a measurement of a degraded metrology mark on an object and/or of a device pattern feature associated with the degraded metrology mark, the degraded metrology mark arising at least in part from the first device lithographic step on the object; and
   prior to a second device lithographic step of the device patterning process on the object, creating a replacement metrology mark, for use in the patterning process in place of the degraded metrology mark, on the object.

2. The method of claim 1, further comprising measuring, using a metrology step, the replacement metrology mark on the object prior to the second device lithographic step.

3. The method of claim 2, comprising measuring the degraded metrology mark and measuring the degraded metrology mark comprises measuring the degraded metrology mark by a first type of metrology, and wherein measuring the replacement metrology mark comprises measuring the replacement metrology mark by a second type of metrology different from the first type of metrology.

4. The method of claim 3, wherein the first and second types of metrology are first and second types of alignment metrology.

5. The method of claim 3, wherein the first type of metrology comprises a stack metrology to determine a positional error of the degraded metrology mark due to one or more layers on or of the degraded metrology mark.

6. The method of claim 1, comprising measuring the degraded metrology mark and measuring the degraded metrology mark comprises measuring the degraded metrology mark by a first type of metrology and wherein the second device lithographic step uses a second type of metrology different from the first type of metrology to measure the replacement metrology mark.

7. The method of claim 1, wherein creating the replacement metrology mark comprises creating the replacement metrology mark at a distance offset.

8. The method of claim 7, further comprising creating a data record for use in the patterning process when measuring the replacement mark, the data record having an identifier of the object and the distance offset of the replacement metrology mark.

9. The method of claim 7, comprising measuring a position of the degraded metrology mark relative to a device pattern feature and wherein the distance offset comprises a distance offset of the replacement metrology mark relative to the device pattern feature.

10. The method of claim 1, further comprising:
    measuring the replacement metrology mark of the object as part of the second device lithographic step; and
    transferring a pattern to the object based on the measurement of the replacement metrology mark.

11. An apparatus, comprising:
    a metrology sensor configured to measure a degraded metrology mark on an object subsequent to a first device lithographic step of a device patterning process and/or measure a device pattern feature associated with the degraded metrology mark, the degraded metrology mark arising at least in part from the first device lithographic step on the object; and
    a mark application device configured to create a replacement metrology mark on the object prior to any subsequent device lithographic step of the device patterning process, wherein the replacement mark is used in the patterning process in place of the degraded metrology mark.

12. The apparatus of claim 11, wherein the mark application device is configured to apply the replacement mark without applying a device pattern.

13. The apparatus of claim 11, wherein the metrology sensor is an alignment sensor configured to determine a position of the degraded metrology mark.

14. The apparatus of claim 11, comprising a further metrology sensor configured to measure the replacement metrology mark according to a second type of mark metrology different from a first type of mark metrology used by the metrology sensor to measure the degraded metrology mark.

15. The apparatus of claim 11, wherein the mark application device is configured to create the replacement mark by an additive process on the object, by removing object material and/or a portion of a layer of resist on the object, by optically transforming material on the object, and/or by imprinting material on the object.

16. The apparatus of claim 11, wherein the mark application device is configured to create the replacement mark at a distance offset from the degraded metrology mark.

17. The apparatus of claim 16, further comprising a computer system configured to create a data record for use in the patterning process when measuring the replacement mark, the data record having an identifier of the object and the distance offset of the replacement metrology mark.

18. The apparatus of claim 11, further comprising a lithographic apparatus configured to measure the replacement metrology mark of the object as part of a lithographic step of the patterning process and to transfer a pattern to the object based on the measurement of the replacement metrology mark.

19. An apparatus, comprising:
- a first metrology sensor configured to measure a degraded metrology mark on the object according to a first type of mark metrology;
- a mark application device configured to apply, based on the measurement of the degraded mark, a replacement metrology mark on the object; and
- a second metrology sensor configured to measure the replacement metrology mark according to a second type of mark metrology different from the first type of mark metrology.

20. The apparatus of claim 19, wherein the first metrology sensor is configured to measure the degraded metrology mark subsequent to a first device lithographic step of a device patterning process on the object, and the mark application device is configured to apply the replacement metrology mark prior to a second device lithographic step of the device patterning process on the object.

* * * * *